US007871943B2

(12) United States Patent
Boescke et al.

(10) Patent No.: US 7,871,943 B2
(45) Date of Patent: Jan. 18, 2011

(54) METHOD OF MAKING TRANSISTOR GATES WITH CONTROLLED WORK FUNCTION

(75) Inventors: Tim Boescke, Dresden (DE); Tobias Mono, Dresden (DE)

(73) Assignee: Qimonda AG, Munich (DE)

(*) Notice: Subject to any disclaimer, the term of this patent is extended or adjusted under 35 U.S.C. 154(b) by 165 days.

(21) Appl. No.: 12/029,980

(22) Filed: Feb. 12, 2008

(65) Prior Publication Data

US 2009/0200618 A1 Aug. 13, 2009

(51) Int. Cl.
*H01L 29/78* (2006.01)

(52) U.S. Cl. ....................... 438/795; 257/407; 438/104; 438/142; 438/149; 438/151; 438/157; 438/197; 438/199

(58) Field of Classification Search ................. 438/104, 438/142, 149, 151, 157, 165, 181, 183, 184, 438/197, 199, 218, 294, 795; 257/407
See application file for complete search history.

(56) References Cited

U.S. PATENT DOCUMENTS 6,458,695 B1 10/2002 Lin et al.
7,045,406 B2 5/2006 Huotari et al.
2005/0095852 A1 5/2005 Saenger et al.
2005/0110098 A1 5/2005 Yoshihara
2006/0006522 A1 1/2006 Doczy et al.
2006/0051924 A1 3/2006 Doczy et al.
2007/0018259 A1* 1/2007 Ko et al. ..................... 257/410
2008/0001202 A1* 1/2008 Schaeffer et al. ............ 257/310

OTHER PUBLICATIONS

Liu et al, "Preparation of Nano-Sized Amorphous Molybdenum Dioxide Powders by Use of Gamma-Ray Radiation Method", 1996, Materials Research Bulletin, vol. 31, No. 8, pp. 1029-1033.*
Venkataraj et al, "Multi-technique Characterization of Tantalum Oxynitride Films Prepared by Reactive Direct Current Magnetron Sputtering", 2005, Thin Solid Films, vol. 514, pp. 1-9.*
D.C. Gilmer et al., "LASER Anneal to Enable Ultimate CMOS Scaling with PMOS Band Edge Metal Gate/High-K Stacks", 2006 Solid-State Device Research Conference, Proceeding of the 36th European ESSDERC 2006, IEEE, Sep. 2006, pp. 351-354.

* cited by examiner

*Primary Examiner*—David Vu
*Assistant Examiner*—Suberr Chi
(74) *Attorney, Agent, or Firm*—Patterson & Sheridan, LLP

(57) ABSTRACT

Embodiments of the invention provide methods for making an integrated circuit comprising providing a substrate, forming a structured layer stack on the substrate comprising a dielectric layer located on the substrate and an oxide-free metallic layer located on the dielectric layer, wherein the metallic layer comprising a transition metal. The method further comprises oxidizing the metallic layer, thereby increasing a work function of the metallic layer. Moreover, a substrate for making an integrated circuit is described.

13 Claims, 6 Drawing Sheets

390
380
360
335
360
330
350
351
310
320'
300

Enthalpy per mol oxygen [kJ/mol]
0
-100
-200
-300
-400
-500
-600
-700
Hf
Zr
Ti
Si
Ta
Nb
V
W
Mo
Ru
Ir Providing a substrate
410
Forming a structured layer stack
- Dielectric layer
- Oxide-free metallic layer
420
Oxidizing the metallic layer
430

METHOD OF MAKING TRANSISTOR GATES WITH CONTROLLED WORK FUNCTION

BACKGROUND OF THE INVENTION

Fabrication of integrated circuits may include a structured layer stack for a gate of a transistor. The structured layer stack may include a dielectric layer located on a substrate and a metallic layer located on the dielectric layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
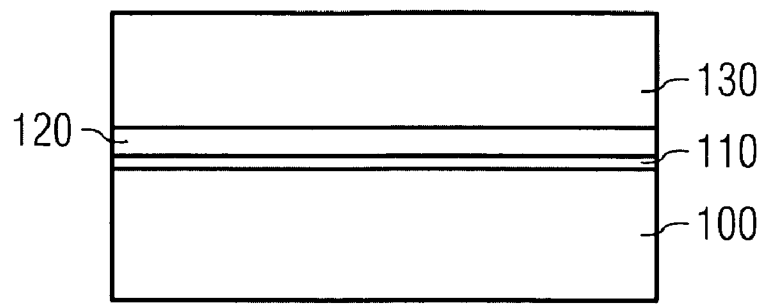
FIGS. 1 to 7 are schematic sectional views of an exemplary substrate illustrating steps of an exemplary method for fabricating a transistor, according to an embodiment of the invention.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Also, signal names used below are exemplary names, indicative of signals used to perform various functions in a given memory device. In some cases, the relative signals may vary from device to device. Furthermore, the circuits and devices described below and depicted in the figures are merely exemplary of embodiments of the invention. As recognized by those of ordinary skill in the art, embodiments of the invention may be utilized with any memory device.

Embodiments of the invention may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (FeRAM), phase-change RAM (PRAM), electrically erasable programmable read-only memory (EEPROM), laser programmable fuses, electrically programmable fuses (e-fuses), and any other types of nonvolatile memory.

Components of integrated circuits such as electrodes frequently include a number or a stack of layers arranged on top of each other. A layer stack for a gate electrode of a field effect transistor may e.g. include a dielectric layer arranged on the semiconductor substrate, the dielectric layer also referred to as "gate dielectric", a metallic layer arranged on the dielectric layer and a conductive layer arranged on the metallic layer. The actual gate may be formed by the metallic and the conductive layer. In one embodiment, the conductive layer may be a doped polysilicon layer, or may include tungsten, aluminum, copper or alike.

The work function of the gate and thus the threshold voltage of the transistor may be influenced by means of the metallic layer arranged on the dielectric layer. The metallic layer is thus also referred to as the "work function layer".

Thereby, the work function of the gate inter alia may depend upon the composition and the thickness of the metallic layer.

With respect to a p-conducting field effect transistor, which is also referred to as p-channel FET or p-FET, a high work function of the gate may lead to a low threshold voltage of the transistor. Potential materials providing a high work function are oxides of transition metals or of transition metal compounds, the transition metals having a high electronegativity. The use of such oxide materials in a metallic layer of a gate may, however, be associated with diffusion processes of the oxygen during the further fabrication of the transistor. The cause for this are temperature steps carried out in the course of the fabrication process, thereby breaking up oxide compounds, so that the unbound oxygen leaves the metallic layer and diffuses into other areas.

A temperature step is e.g. carried out in order to activate dopants implanted into the substrate to form the source/drain regions. Such a temperature step which is also referred to as activation is e.g. carried out at a temperature of approximately 1000° C. and for a duration of several seconds. A temperature step may furthermore be carried out in order to anneal defects. In such an annealing step which may e.g. be effected during fabrication of a DRAM component (DRAM—dynamic random access memory) in order to cure defects in memory cells, the relevant substrate may e.g. be heated to a temperature between 600 and 850° C. and kept at this temperature for a duration of e.g. one hour.

The oxygen loss of the metallic layer due to the diffusion processes may result in the work function of the metallic layer and thus of the gate being reduced. Furthermore, the oxygen may diffuse into the substrate below the dielectric layer and cause a formation of oxide there, thereby enlarging the dielectric layer or forming a further dielectric layer below the dielectric layer. Altogether, the oxide formation may result in an enlargement of the effective oxide thickness (EOT) of the gate stack below the metallic layer and may thus further affect the functionality of the transistor. Moreover, the unbound oxygen may also diffuse into the conductive layer arranged above the metallic layer and form an oxide at the junction between the metallic and the conductive layer, which is e.g. the case when using polysilicon as a material for the conductive layer.

In order to avoid such effects, a transistor may be fabricated by means of a so-called “replacement gate” process. In this process, a structural element corresponding to the gate structure is at first formed and this structural element is subsequently replaced by the gate stack comprising the metallic layer. Temperature steps in the course of the process, such as an activation anneal, are then carried out in the presence of the structural element, i.e. prior to fabrication of the actual gate.

By means of this procedure, an oxygen diffusion from the metallic layer of the gate may be avoided. Due to the additional process steps connected to the use of the structural element and the subsequent fabrication of the gate, however, the process is relatively complex and may thus result in fabrication-related defects. Moreover, the subsequent forming of the gate by providing the metallic layer and the conductive layer to replace the structural element may result in the metallic layer being arranged not only on the dielectric layer after removing the structural element, as originally intended, but also to a large extent on spacers surrounding the structural element or the gate stack, respectively. Spacers may be formed at the sidewalls of a gate in order to implant dopants for source-drain-regions into the substrate in a laterally displaced manner with regard to the gate. Since the metallic layer may have a relatively high electric resistance when using a transition metal oxide, the unintentional formation of the metallic layer on the spacers may result in an increased resistance of the gate.

A further approach for preventing oxygen loss in the metallic layer comprises carrying out a temperature step for activating implanted dopants in a relatively short time. For example, the substrate may be heated to a relatively high temperature of e.g. 1300° C. for a duration in the range of milliseconds by means of a laser pulse. By means of such a laser anneal, an out-diffusion of oxygen from the metallic layer may, however, not be completely prevented. Moreover, a short-term annealing step may not replace a temperature step for curing defects, which is carried out for a considerably longer period of time.

In the following paragraphs, further embodiments are described relating to the fabrication of an integrated circuit including a structured layer stack and the structured layer stack comprising a metallic layer.

Figure 18:
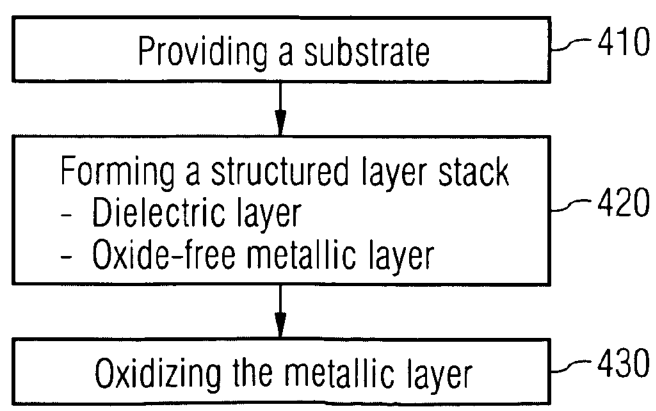
FIG. 18 illustrates an exemplary flow diagram of a method for making an integrated circuit, according to an embodiment of the invention.

One embodiment includes a method of making an integrated circuit and is illustrated in the exemplary flow diagram of FIG. 18. The method comprises providing a substrate (step 410) and forming a structured layer stack on the substrate for a gate of a transistor comprising a dielectric layer located on the substrate and an oxide-free metallic layer located on the dielectric layer, the metallic layer comprising a transition metal (step 420). The method further comprises oxidizing the metallic layer, thereby increasing a work function of the metallic layer (step 430).

Another embodiment comprises a substrate for making an integrated circuit including a structured layer stack as a precursor of a gate stack of a transistor. The structured layer stack comprises a dielectric layer located on a surface of the substrate, an oxide-free metallic first layer located on the dielectric layer, the first layer comprising a transition metal, and a second layer located on the first layer, the second layer comprising oxygen. The first layer and the second layer are further selected in such a way that carrying out a temperature step causes a diffusion of oxygen from the second layer into the first layer. This may cause an increase of the work function of the first layer.

Further embodiments are explained in conjunction with the following drawings. These embodiments relate to the fabrication of a field effect transistor for an integrated circuit.

In the embodiments disclosed herein, a metallic layer for the gate of the transistor is first formed without oxygen content and subjected to an oxidation process at a later process stage. The metallic layer may determine the work function of the gate and thus the threshold voltage of the transistor. Therefore, an out-diffusion of oxygen from the metallic layer and an associated impact on the transistor, particularly a reduction of the gate work function, may be prevented. Temperature steps which form part of the fabrication process may be performed before the oxidation process, or alternatively may be specifically performed for oxidizing the metallic layer.

FIGS. 1 to 7 show exemplary schematic lateral sectional views of a substrate 100 illustrating steps of an exemplary method for fabricating a field effect transistor 190 comprising a gate 180 according to an embodiment. The substrate 100 comprising a semiconductor material such as silicon e.g. represents a semiconductor disc referred to as “wafer”. The field effect transistor 190 to be fabricated may e.g. be a p-FET transistor. With respect to such a transistor type, the substrate 100 may be n-doped in a region in which a conducting channel is generated during operation of the transistor 190 (not shown).

As depicted in FIG. 1, a dielectric layer 110 may be deposited on the surface of the provided substrate 100. Moreover, a substantially oxide-free metallic layer 120 may be deposited on the dielectric layer 110 and a sacrificial layer 130 may be deposited on the metallic layer 120. The application of the layers 110, 120, 130 may each be carried out by means of a deposition method such as the ALD process (atomic layer deposition), the CVD process (chemical vapor deposition) or the PVD process (physical vapor deposition).

The dielectric layer 110 forming the gate dielectric in the transistor 190 e.g. may include a high-k dielectric. By using such a material, an improved capacitive coupling of the gate 180 of the transistor 190 to the underlying substrate material may be achieved. Additionally, a potential leakage current through the dielectric layer 110 may be reduced during operation of the transistor 190. Potential high-k dielectrics which may be considered for the dielectric layer 100 e.g. include the materials ZrO, ZrSiO, HfZrO, LaSiO, HfSiO, HfSiON, HfO, BaTiO, SrZrO, SrTiO, LaO, DyO and AlO. The dielectric layer 110 may include the mentioned materials individually or in the form of material mixes. A layer stack comprising several dielectric materials may also be considered. Alternative materials for the dielectric layer 110 may include, for example, silicon dioxide and silicon oxynitride.

The metallic layer 120, which may be deposited on the dielectric layer 110 substantially without oxygen, comprises a transition metal which may have a high electronegativity. Exemplary transition metals that may be used to form the metallic layer 120 may include the elements Ta, Nb, V, W, Mo, Ru, Ir, Re, Os, Rh, Pd, Ni and Co. In some embodiments, the transition metal of the metallic layer 120 may be provided in the form of a pure metal, a carbide, a nitride and/or a carbonitride. Moreover, the metallic layer 120 may comprise several different transition metals instead of one single transition metal. The term "transition metal" as it is used here and in the following relates to all elements of groups 3 to 12 of the periodic table of the chemical elements.

The sacrificial layer 130 may include a material which may be removed in an etching process with a high selectivity compared to the underlying metallic layer 120. A potential material for this purpose is e.g. silicon. Further potential materials for the sacrificial layer 130 are e.g. germanium, tungsten, silicon nitride or carbon.

Figure 2:
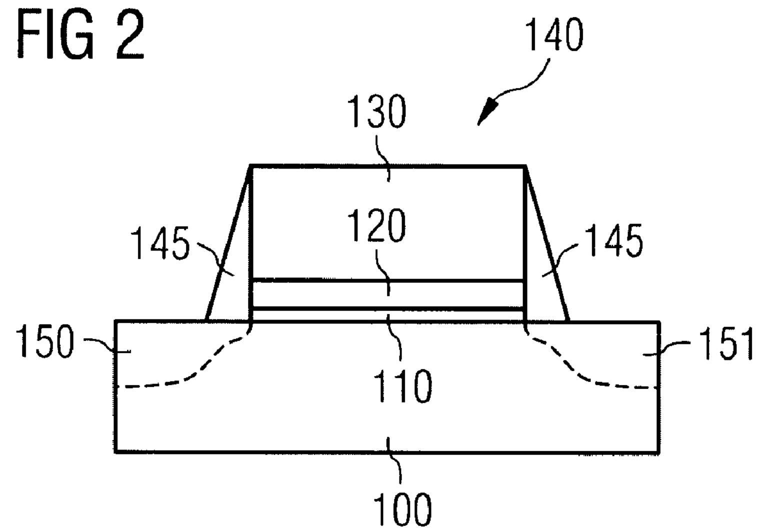

The layers deposited on the substrate 100 may be subsequently structured in order to form a structured layer stack 140 as shown in FIG. 2. In one embodiment, to form the structured layer stack 140, a dry etching process may be carried out. The dry etching process is e.g. a reactive ion etching process (RIE), which may provide a high etching rate and a high degree of anisotropy. In order to define the lateral structure of the layer stack 140, a corresponding area on the sacrificial layer 130 is covered by means of one or several suitable masking layers prior to carrying out the etching process (not shown). In one embodiment, a photoresist layer may be deposited on the sacrificial layer 130 and structured by carrying out a lithographic process. It is also possible to use a hard mask layer on the sacrificial layer 130 which may be structured in an additional etching process by means of a masking photoresist layer.

In the course of the structuring step for forming the layer stack 140, respective uncovered areas of the individual layers may be removed. The dry etching process may be carried out until the surface of the substrate 100 is reached, i.e. so that also the uncovered portion of the dielectric layer 100 is removed during the dry etching process. Alternatively, it is possible to terminate the dry etching process when reaching the dielectric layer 110 so that the dielectric layer 110 serves as an etch stop layer. In such a case the uncovered portion of the dielectric layer 110 may be removed subsequently or later e.g. in an additional wet or dry chemistry etching process.

As shown in FIG. 2, two doped regions 150, 151 that are separated from each other in the substrate 100 may be formed in a region below the layer stack 140. The two doped regions 150, 151 may constitute source and drain of the transistor 190. The formation of the doped regions 150, 151 may include carrying out an ion implantation process in order to introduce corresponding dopants into the substrate 100. With respect to a p-conducting transistor 190, the regions 150, 151 may be formed as p-doped regions. The p-doped regions 150, 151 may be separated from each other by an n-doped substrate region.

In one embodiment, dielectric spacers 145 may be formed at the sidewalls of the layer stack 140 prior to carrying out the ion implant, as shown in FIG. 2. In order to form the spacers 145, a layer also referred to as a "liner" may be deposited on the upper face of the substrate 100 and on the layer stack 140, and a dry etching process may subsequently be performed, so that the spacers 145 remain at the sidewalls of the layer stack 140. In one embodiment, the material for the liner layer and thus for the spacers 145, may include silicon dioxide. The liner layer may be deposited on the upper substrate face using, for example, a CVD process such as the TEOS process using tetraethyl orthosilicate (TEOS) as a source material, thereby allowing uniform layer deposition.

As shown in FIG. 2, the spacers 145 may be formed directly on the surface of the substrate 100. This may be the case if the dielectric layer 110 is structured during a dry etching process described above and used for layer structuring or in an additional wet or dry chemistry etching process prior to the fabrication of the spacers 145. Alternatively, it is possible in the etching process to initially only structure the sacrificial layer 130 and the metallic layer 120, to subsequently form the spacers 145, followed by removing the uncovered portion of the dielectric layer 110, e.g. by carrying out a wet chemistry etching process. In such a procedure, the spacers 145 may be formed on the dielectric layer 110 (not shown).

The implanted dopants may be activated by performing a temperature or an annealing step following an ion implant. Such a temperature step may be performed in various ways. For example, the substrate 100 may be heated to a temperature of approximately 800° C. and kept at this temperature for a duration of e.g. 10 minutes. It is also possible to heat the substrate to a temperature of e.g. 1000° C. for a duration of several seconds. Furthermore, the substrate 100 may be heated for a very short time duration, e.g. a duration in the range of milliseconds, to a relatively high temperature of e.g. 1300° C., using a laser for heating.

Instead of a single ion implantation process for forming the doped regions 150, 151, an ion implantation may be performed several times. For example, (prior to or after removing an uncovered portion of the dielectric layer 110) first spacers at the sidewalls of the layer stack 140 may be formed and in a first ion implantation (carried out after removing an uncovered portion of the dielectric layer 110), dopants may be introduced into the substrate 100 in relatively close proximity to the surface, which is also referred to as LDD doping (lightly doped drain). Furthermore, second spacers may be formed adjacent to the first spacers and in a second ion implant, dopants may be introduced deeper into the substrate 100. Such a multi-stage procedure is indicated by the shape of the doped regions 150, 151 shown in FIG. 2. Thus, the illustrated spacers 145 are composed of the above described first and second spacers. Furthermore, an additional ion implanting process may be performed, in which dopants are introduced at a defined angle laterally below the layer stack 140. This process, which is also referred to as halo implantation, may allow for improvement of the short channel characteristics of the transistor 190. The activation of the dopants in such a multi-stage implantation may be performed by means of a single temperature step. This temperature step may be employed after the last ion implanting process. It is also possible to carry out a respective temperature step after the individual ion implantations.

Figure 3:
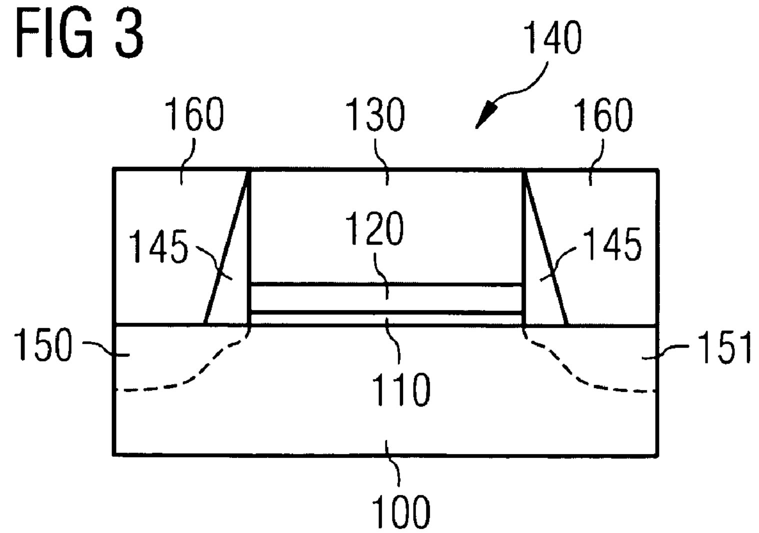

As depicted in FIG. 3, a further dielectric layer 160 may be subsequently deposited on the substrate 100, the dielectric layer 160 adjoining the spacers 145. In one embodiment, the surface of the sacrificial layer 130 may subsequently be uncovered. For example, to form the dielectric layer 160, a corresponding dielectric material may be deposited on the upper face of the substrate 100 and on the spacers 145 and the sacrificial layer 130, respectively, and thereafter, a polishing process such as a CMP process (chemical-mechanical polishing) may be carried out, so that the dielectric material above the upper edge of the spacers 145 or above the sacrificial layer 130, respectively, is removed and the surface of the sacrificial layer 130 is uncovered.

In one embodiment, boron phosphorus silicate glass (BPSG) may be used as a material to form the dielectric layer 160. The deposition of such a material may e.g. be carried out by means of a CVD process. It is also possible to use a spin-on-dielectric (SOD) which is deposited on the substrate 100 while the substrate 100 rotates. In alternative embodiments, silicon dioxide may be used form the dielectric layer 160 which is e.g. deposited on the upper substrate face by performing a TEOS process.

Figure 4:
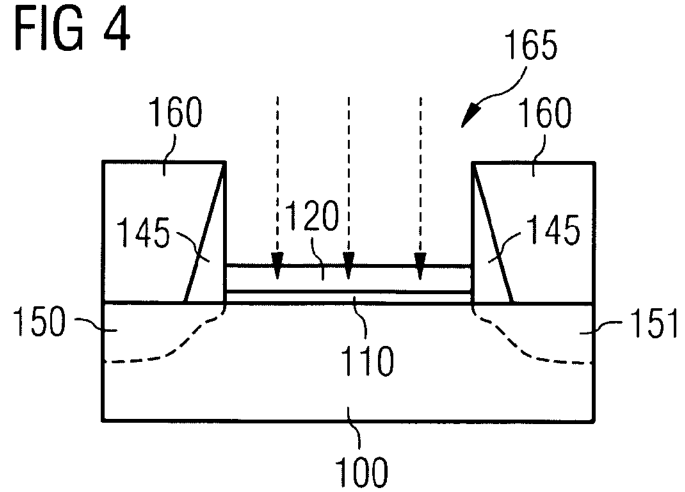

After the formation of the dielectric layer 160, the sacrificial layer 130 may be removed so that a recess 165 is provided between the spacers 145 as shown in FIG. 4, and a surface of the metallic layer 120 is uncovered. In order to selectively remove the sacrificial layer 130, a wet chemistry etching process may be carried out. In the case of a sacrificial layer 130 comprising silicon, a wet chemistry etch using, for example, ammonia may be considered. A sacrificial layer 130 comprising other materials like e.g. tungsten and carbon may be removed by means of a dry etching process like e.g. reactive ion etching.

After removing the sacrificial layer 130 and uncovering the surface of the metallic layer 120, the metallic layer 120 may be oxidized, as indicated in FIG. 4 by means of arrows. In this manner, the work function of the metallic layer 120 and thus of the later gate 180 may be increased and as a result, the threshold voltage of the transistor 190 may be reduced.

The oxidation of the metallic layer 120 may be carried out in various ways. In one embodiment, the substrate 100 may be heated in an oxygen-comprising atmosphere, thus causing a thermal oxidation of the metallic layer 120. The temperature of this method step may be selected depending from the material of the metallic layer 120 and may be in a temperature range of up to 1000° C. Instead of a thermal oxidation, an ion implantation may also be carried out in order to introduce oxygen into the metallic layer 120 and to thereby cause an oxidation of the metallic layer 120. Alternatively, it may be possible to carry out a plasma oxidation for oxidizing the metallic layer 120. In this process, the substrate 100 may be subjected to a reactive oxygen-comprising plasma. In these various method steps, the substrate 100 is protected from oxidation in a region located laterally from the metallic layer 120 by the dielectric layer 160 or the spacers 145, respectively.

Figure 5:
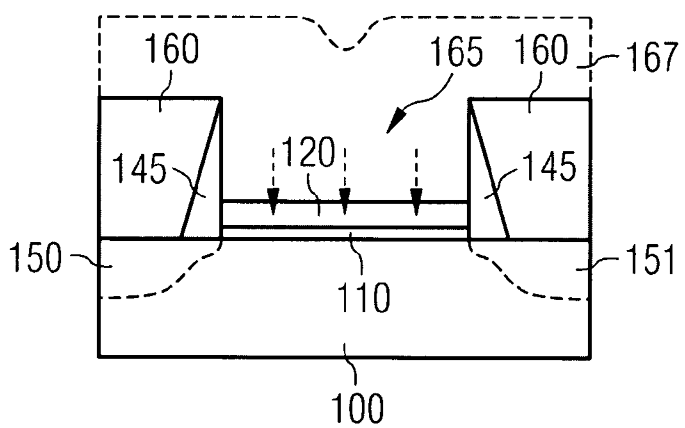

A further possibility of oxidizing the metallic layer 120 is illustrated in FIG. 5. Here, an oxygen-comprising layer 167 is deposited on the substrate 100 and thus on the uncovered surface of the metallic layer 120, the oxygen-comprising layer 167 at least partially filling the recess 165 and acting as an "oxygen source" for the metallic layer 120. The material of the layer 167 is selected in such a way that a subsequent heating of the substrate 100 causes a diffusion of oxygen from the layer 167 into the metallic layer 120 and thus an oxidation of the metallic layer 120, which is indicated in FIG. 5 by means of arrows. In the temperature step, the substrate 100 may e.g. be heated to a temperature in a range of up to 1300° C. In order to transfer a large amount of oxygen from the layer 167 to the metallic layer 120, the metallic layer 120 may have a higher oxygen affinity than the layer 167. The layer 167 may for example be an oxygen-comprising organic layer like e.g. a polymer layer or a metal oxide layer. Afterwards, the layer 167 may be removed from the substrate 100.

Figure 6:
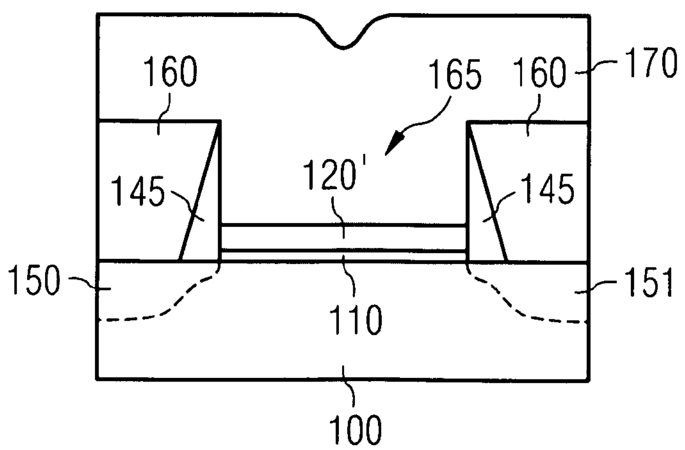

After the oxidation of the metallic layer 120, a conductive layer 170 may be deposited on the upper side of the substrate 100 in a large-area manner, i.e. on the dielectric layer 160, the spacers 145 and the oxidized metallic layer 120' as shown in FIG. 6, thus filling the recess 165. The conductive layer 170 may for example comprise doped polysilicon and may be produced in situ by means of a CVD process. However, a doping of the layer 170 may also be carried out later by means of an ion implanting process. Instead of polysilicon the conductive layer 170 may also comprise tungsten. This material may be deposited by means of a CVD method or by means of a sputtering process. A further possible material for the conductive layer 170 is a highly conductive metal such as copper. The deposition of this metal may be carried out by means of an electroplating process. Prior to such an electroplating process, a seed layer of the relevant material may e.g. be deposited on the upper substrate face by means of a CVD process. Alternatively, aluminum may be used for the conductive layer 170 which is deposited e.g. by means of a CVD or a PVD method.

Figure 7:
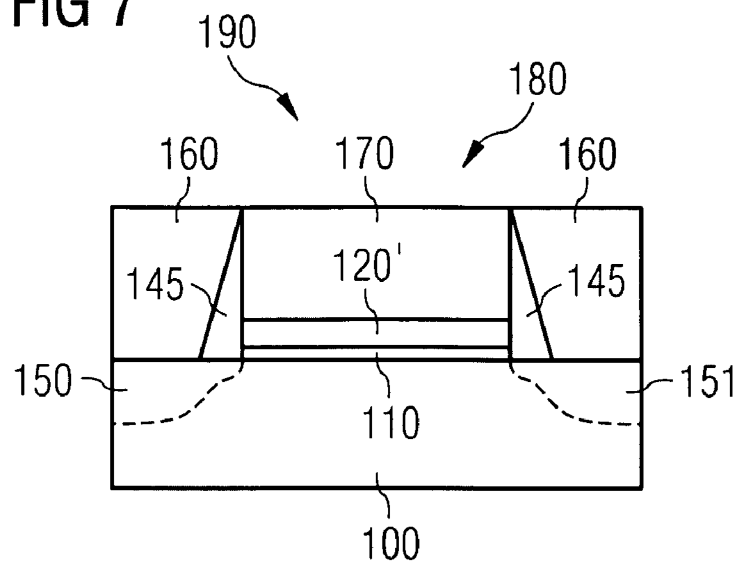

Following this step, the conductive layer 170 is partially removed so that the conductive layer 170 remains primarily inside the recess, as illustrated in FIG. 7. This method step may be carried out by means of a polishing process, e.g. a CMP process. In this manner, the gate 180 comprising the oxidized metallic layer 120' and thus the transistor 190 are substantially finished. By means of the metallic layer 120', the work function of the gate 180 and thus the threshold voltage of the transistor 190 may be determined.

In the method described in conjunction with FIGS. 1 to 7, the metallic layer 120 is first formed in an oxide-free manner and is oxidized in a later process stage. In this manner, an out-diffusion of oxygen from the metallic layer 120' and the resulting impact on the transistor 190 may be prevented. The method offers the possibility of performing temperature steps such as an activation anneal for activating implanted dopants (which might cause out-diffusion of oxygen from the metallic layer 120') prior to an oxidization of the metallic layer 120. This correspondingly applies to a temperature step for curing defects in which the substrate 100 is e.g. heated to a temperature between 600 and 850° C. and kept at this temperature for a time period of e.g. one hour. Such an annealing step may e.g. be carried out prior to the fabrication of the dielectric layer 160.

Alternatively, the method makes it possible to apply a temperature step for various purposes. In this regard, a temperature step used for oxidizing the metallic layer 120, such as the above-described heating of the substrate 100 in an oxygen-comprising atmosphere or the heating of the substrate 100 having the applied oxygen-comprising layer 167 may simultaneously be employed for activating dopants and/or for annealing defects instead of carrying out separate temperature steps.

FIGS. 8 to 12 show exemplary schematic lateral sectional views of an exemplary substrate 200 illustrating steps of a method for fabricating a field effect transistor 290 comprising a gate 280 according to a further embodiment of the invention. The substrate 200 which may be e.g. a wafer including a semiconductor material such as silicon. The transistor 290 to be produced may be a p-FET transistor. In this case, the substrate 200 may be n-doped in a region in which a conducting channel is generated during operation of the transistor 290 (not shown).

Figure 8:
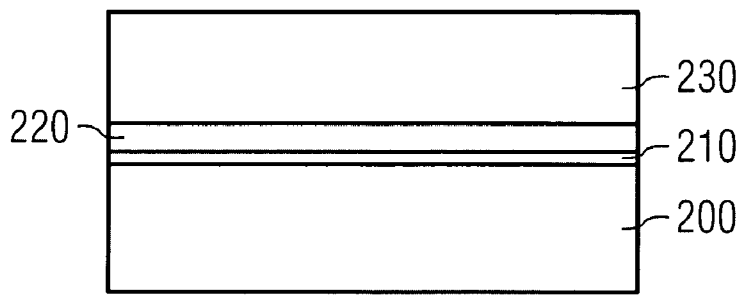
FIGS. 8 to 12 are schematic sectional views of an exemplary substrate illustrating steps of a further exemplary method for fabricating a transistor, according to an embodiment of the invention.

As shown in FIG. 8, a dielectric layer 210 may be deposited on the provided substrate 200. Furthermore, a substantially oxide-free metallic layer 220 may be deposited on the dielectric layer 210 and a conductive layer 230 may be deposited on the metallic layer 220. Additionally, an optional capping layer may be deposited on the conductive layer 230 (not shown). The application of the individual layers 210, 220, 230 may be performed by means of a suitable deposition method such as the ALD, the CVD or the PVD process, respectively.

The dielectric layer 210 may form the gate dielectric in the transistor 290 and for example include a high-k dielectric, thus making it possible to achieve an improved capacitive coupling of the gate 280 to the underlying substrate material and to reduce a potential leakage current through the dielectric layer 210 when operating the transistor 290. High-k dielectrics that may be considered for the layer 210 include materials such as ZrO, ZrSiO, HfZrO, LaSiO, HfSiO, HfSiON, HfO, BaTiO, SrZrO, SrTiO, LaO, DyO and AlO. The mentioned material may be provided individually or in the form of material mixes. A layer stack comprising several dielectric materials may also be considered. Alternative materials for the dielectric layer 210 can include e.g. silicon dioxide and silicon oxynitride.

The metallic layer 220, which is deposited substantially without oxygen, may include a transition metal which may have a high electronegativity, such as e.g. Ta, Nb, V, W, Mo, Ru, Ir, Re, Os, Rh, Pd, Ni and Co. The transition metal of the metallic layer 220 may be provided in the form of a pure metal, a carbide, a nitride and/or a carbonitride. Moreover, the metallic layer 220 may include several different transition metals instead of one single transition metal. For the conductive layer 230 arranged on the metallic layer 220 e.g. tungsten or tungsten nitride may be used. The materials of the metallic layer 220 and of the conductive layer 230 may be selected in such a way that the metallic layer 220 includes a higher oxygen affinity than the conductive layer 230 or that oxide compounds of the material of the metallic layer 220 are more stable than oxide compounds of the material of the conductive layer 230. The optional capping layer (not shown) deposited on the conductive layer 230 may e.g. comprise silicon nitride.

Figure 9:
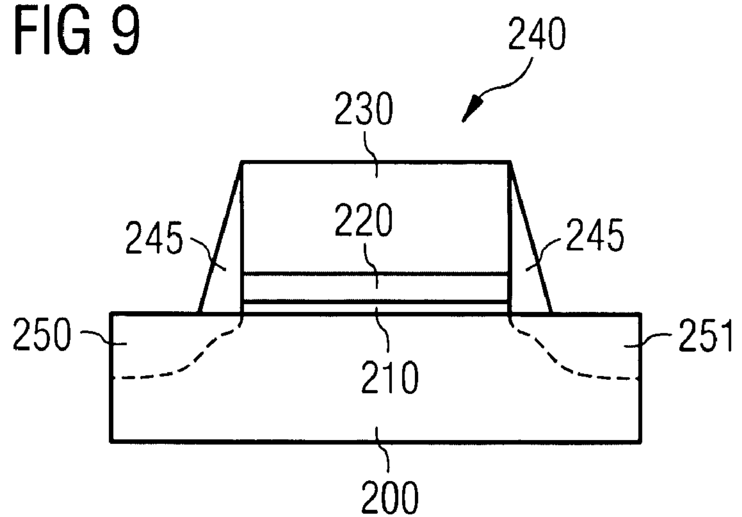

The deposited layers may be subsequently structured in order to configure a structured layer stack 240 such as depicted in FIG. 9. This structuring step may be e.g. carried out by means of a dry etching process such as reactive ion etching. In order to define the lateral structure of the layer stack 240, a corresponding area of the conductive layer 230 may be covered by one or several suitable masking layers prior to performing the etching process (not shown). In one embodiment, a structured photoresist layer generated by means of a lithographic process or a hard mask layer structured in an additional etching process may be used.

In the course of the structuring step, respective uncovered areas of the individual layers may be removed. The dry etching process may be carried out until the surface of the substrate 200 is reached, i.e. the uncovered portion of the dielectric layer 210 is also removed in the dry etching process. Alternatively, the dry etching process may be terminated as soon as the dielectric layer 210 is reached and uncovered. The uncovered portion of the dielectric layer 210 may subsequently or later be removed e.g. in an additional wet or dry chemistry etching process.

Furthermore, as shown in FIG. 9, two doped regions 250, 251 may be formed in the substrate 200 in a region below the layer stack 240. The two doped regions 250 and 250 may be separated from each other, the two separate doped regions constituting source and drain of the transistor 290. The forming of the doped regions 250, 251 may include performing an ion implantation process in order to introduce dopants into the substrate 200. With respect to a p-conducting transistor 290, the regions 250, 251 may be formed as p-doped regions. The p-doped regions 150, 151 may be separated from each other by an n-doped substrate region.

Prior to performing the ion implant, dielectric spacers 245 may be formed at the sidewalls of the layer stack 240, as shown in FIG. 9, in order to implant the dopants into the substrate 200 in a laterally displaced manner with regard to the layer stack 240. The doping of the substrate 200 may furthermore be carried out in several stages by forming first and second spacers and by performing a first and a second ion implant. Such a multi-stage procedure is indicated by the shape of the doped regions 250, 251 shown in FIG. 9. Additionally, a halo implantation may be carried out, as well. The activation of the implanted dopants may be carried out within the framework of (at least) one temperature step which may be carried out following an ion implantation or in a later process stage. With respect to these method steps as well as to further details concerning e.g. the forming of the spacers 245, reference is made to the aforementioned information on the method described in conjunction with FIGS. 1 to 7.

Figure 10:
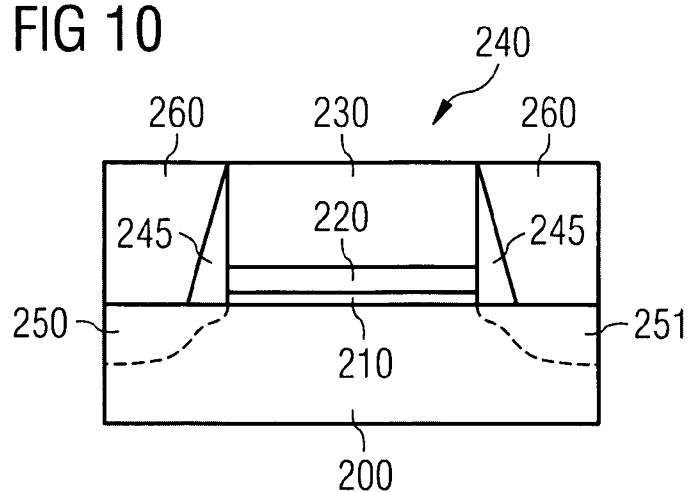

Subsequently, as shown in FIG. 10, a further dielectric layer 260 may be formed on the substrate 200 adjoining the spacers 245, wherein a surface of the structured layer stack 240 is uncovered. In order to form the dielectric layer 260, a corresponding dielectric material may be deposited on the upper face of the substrate 200 and subsequently, a polishing process such as a CMP process may be carried out in order to remove the dielectric material above the layer stack 240 and thus to uncover the surface of the layer stack 240. Potential materials for the dielectric layer include BPSG which may be deposited by means of a CVD process, a spin-on dielectric, or silicon dioxide which may be deposited by means of a TEOS process.

Figure 11:
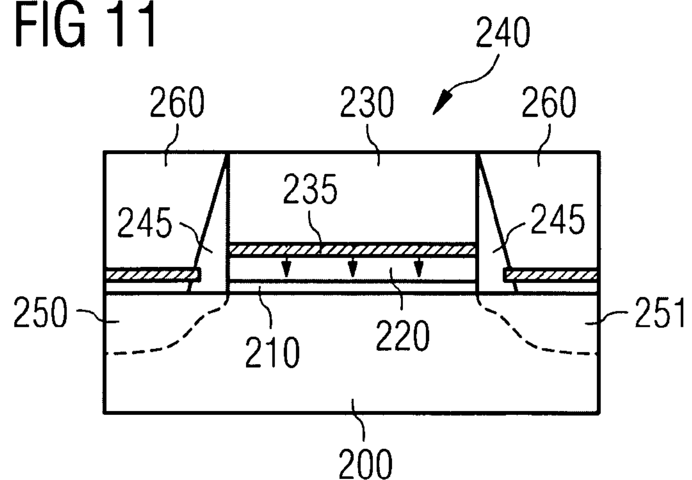

In a subsequent process step, an ion implantation may be performed in order to introduce oxygen into an area 235 of the conductive layer 230 above the metallic layer 220, as shown in FIG. 11, thus turning the conductive layer 230 into an “oxygen source” for the metallic layer 220. In this step, the implanting of oxygen may also occur into a region of the dielectric layer 260, which in FIG. 11 is indicated by the shading. Since the dielectric layer 260 comprises a lower density compared to the conductive layer 230, the oxygen may be implanted deeper into the dielectric layer 260 when compared to the conductive layer 230. However, the height of the layer stack 240 and thus of the dielectric layer 260 may be selected in such a way that the implantation depth in the dielectric layer 260 does not reach to the surface of the substrate 200, so that the substrate 200 is protected from interfering oxygen doping by the dielectric layer 260. The same applies to the dielectric spacers 245 which may also be subjected to oxygen implantation.

After forming the oxygen-comprising area 235 in the conductive layer 230, a temperature step may be performed in order to cause an oxygen diffusion from the area 235 of the conductive layer 230 into the metallic layer 220 and thus an oxidation of the metallic layer 220. The oxygen diffusion is indicated in FIG. 11 by arrows. The temperature step for causing the diffusion may e.g. be performed at a temperature in a range of up to 1100° C. and for a time period from one second up to several hours. These parameters of the temperature step may e.g. be dependent upon the materials of the conductive layer 230 and of the metallic layer 220, as well as upon the implanted amount of oxygen.

Figure 12:
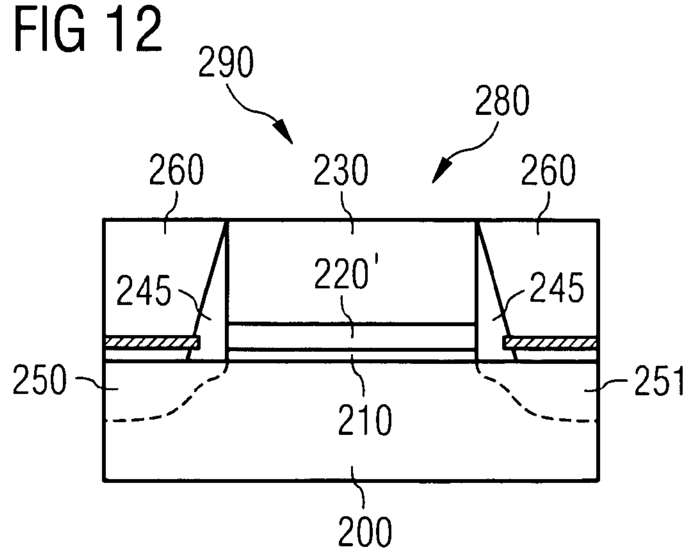

In order to achieve diffusion of a large amount of oxygen or of substantially the entire oxygen present in the conductive layer 230 into the metallic layer 220, the metallic layer 220 may have a higher oxygen affinity than the conductive layer 230. In this manner, e.g. a "re-transport" of oxygen from the oxidized metallic layer 220' into the conductive layer 230 may be suppressed. After oxidizing the metallic layer 220', the transistor 290 comprising the gate 280 is substantially finished, as shown in FIG. 12. By means of the metallic layer 220', the work function of the gate 280 and thus the threshold voltage of the transistor 290 are influenced. Hereby, the conductive layer 230 may no longer have any oxygen-comprising area 235.

The method described in conjunction with FIGS. 8 to 12 is also based on the approach to first form the metallic layer 220 without an oxygen portion and to oxidize it in a later process stage, whereby an out-diffusion of oxygen from the metallic layer 220' may be avoided. Temperature steps such as an annealing step for activating implanted dopants or an annealing step for curing defects may be performed prior to an oxidization of the metallic layer 220. Alternatively, it may be possible to use a temperature step for various purposes, i.e. for example for achieving the oxygen diffusion from the conductive layer 230 into the metallic layer 220 together with the activation of implanted dopants and/or together with the annealing of defects in a shared temperature step, instead of carrying out annealing steps on their own.

The following FIGS. 13 to 16 show exemplary schematic lateral sectional views of an exemplary substrate 300 for illustrating steps of a method for fabricating a field effect transistor 390 comprising a gate 380 according to a further embodiment. The method may include acquiring a substrate 300 comprising a semiconductor material such as silicon. The transistor 390 to be fabricated may e.g. be a p-FET transistor. In such a transistor type, the substrate 300 may be n-doped in a region in which a conducting channel is generated during operation of the transistor 390 (not shown).

Figure 13:
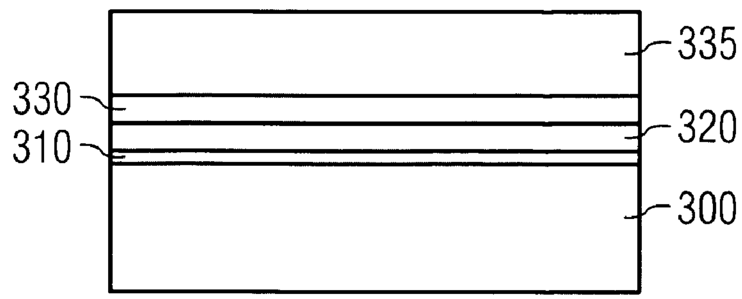
FIGS. 13 to 16 are schematic sectional views of an exemplary substrate illustrating steps of another exemplary method for fabricating a transistor, according to an embodiment of the invention.

As illustrated in FIG. 13, a dielectric layer 310 may be deposited on the provided substrate 300. Subsequently, a substantially oxide-free metallic layer 320 may be deposited on the dielectric layer 310, a metal oxide layer 330 may be deposited on the metallic layer 320 and a conductive layer 335 may be deposited on the metal oxide layer 330. Additionally, an optional capping layer may be deposited on the conductive layer 335 (not shown). The application of the individual layers 310, 320, 330, 335 may be performed by means of a deposition method such as the ALD, the CVD or the PVD process, respectively.

The dielectric layer 310 which may form the gate dielectric in the transistor 390 may include a high-k dielectric, thus allowing for an improved capacitive coupling of the gate 380 to the underlying substrate material and reducing a potential leakage current through the dielectric layer 310 during operation of the transistor 390. High-k dielectrics that may be considered for the layer 310 include materials such as ZrO, ZrSiO, HfZrO, LaSiO, HfSiO, HfSiON, HfO, BaTiO, SrZrO, SrTiO, LaO, DyO and AlO. The mentioned materials may be provided individually or in the form of material mixes. A layer stack comprising several dielectric materials may also be considered. Alternative materials for the dielectric layer 310 include silicon dioxide and silicon oxynitride.

The metallic layer 320, which is deposited in a substantially oxide-free manner may include a transition metal which may have a high electronegativity such as Ta, Nb, V, W, Mo, Ru, Ir, Re, Os, Rh, Pd, Ni and Co. The transition metal of the metallic layer 320 may be present in the form of a pure metal, a carbide, a nitride and/or a carbonitride. Moreover, the metallic layer 320 may include several different transition metals instead of one single transition metal. The metal oxide layer 330 arranged on the metallic layer 320 may also include a transition metal. The transition metal may be present in the form of a pure metal, a carbide, a nitride and/or a carbonitride, as well. For the conductive layer 335 arranged on the metal oxide layer 330 e.g. tungsten, aluminum, copper or tungsten nitride may be used. The optional capping layer (not shown) deposited on the conductive layer 335 may e.g. comprise silicon nitride.

Figure 14:
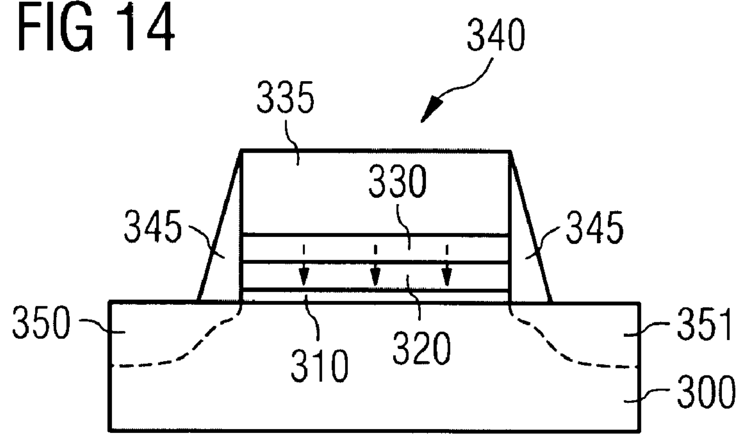

The layers deposited on the substrate 300 may be subsequently structured, whereby a structured layer stack 340 as illustrated in FIG. 14 is formed. For this purpose, for example a dry etching process such as reactive ion etching is performed. In order to define the lateral structure of the layer stack 340, a corresponding area of the conductive layer 335 may be covered with one or several suitable masking layers (not shown) prior to performing the etching process. Use may be made of a structured photoresist layer generated by means of a lithographic process or also of a hard mask layer structured in an additional etching process.

In the course of the structuring step, respective uncovered areas of the individual layers may be removed. The dry etching process may be performed until the surface of the substrate 300 is reached, i.e. also the uncovered portion of the dielectric layer 310 is removed in the dry etching process. Alternatively, the dry etching process may be terminated as soon as the dielectric layer 310 is reached. The uncovered portion of the dielectric layer 310 may in such a case be removed subsequently or later e.g. by means of an additional wet or dry chemistry etching process.

Furthermore, as illustrated in FIG. 14, two separate doped regions 350, 351 may be formed in the substrate 300 in a region below the layer stack 340. The doped regions 350, 351 may form source and drain of the transistor 390. The forming of the doped regions 350, 351 may include performing of an ion implantation process in order to introduce dopants into the substrate 300. With respect to a p-conducting transistor 390, the regions 350, 351 may be formed as p-doped regions. Here, the p-doped regions 350, 351 may be separated from each other by means of an n-doped substrate region.

Prior to carrying out the ion implant, spacers 345 may be formed at the sidewalls of the layer stack 340, as shown in FIG. 14, thus enabling the dopants to be implanted into the substrate 300 in a laterally displaced manner with regard to the layer stack 340. The doping of the substrate 300 may furthermore be carried out in several stages by forming first and second spacers and by performing a first and a second ion implant. Such a multi-stage procedure is indicated by the shape of the doped regions 350, 351 shown in FIG. 14. Moreover, a halo implantation may additionally be carried out. In order to activate the implanted dopants, (at least) one temperature or annealing step may be performed, e.g. following an ion implantation or at a later process stage. With regard to these method steps as well as to further details concerning e.g.

the forming of the spacers 345, reference is made to the information given with regard to the method described in conjunction with FIGS. 1 to 7.

By performing (at least) one temperature step, a diffusion of oxygen from the metal oxide layer 330 into the metallic layer 320, indicated by arrows in FIG. 14, and thus an oxidation of the metallic layer 320 is furthermore achieved. This temperature step may particularly be an aforementioned annealing step for activating dopants and/or an annealing step for curing defects. Such a temperature step may be carried out at a temperature in a range of up to 1300° C.

In order to transfer a high oxygen amount from the metal oxide layer 330 acting as an "oxygen source" into the metallic layer 320, the metallic layer 320 and the metal oxide layer 330 may be selected in such a way that an oxide of the transition metal or of the transition metal compound (carbide, nitride, carbonitride) of the metallic layer 320 exhibits a higher binding energy than is the case for an oxide of the transition metal or of the transition metal compound of the metal oxide layer 330. In this manner, e.g. a "re-transport" of oxygen from the oxidized metallic layer 320' into the metal oxide layer 330 may be suppressed. Correspondingly, the conductive layer 335 may comprise a lower oxygen affinity compared to the metal oxide layer 330 so that the oxygen substantially diffuses into the metallic layer 320 and not into the conductive layer 335.

Figure 17:
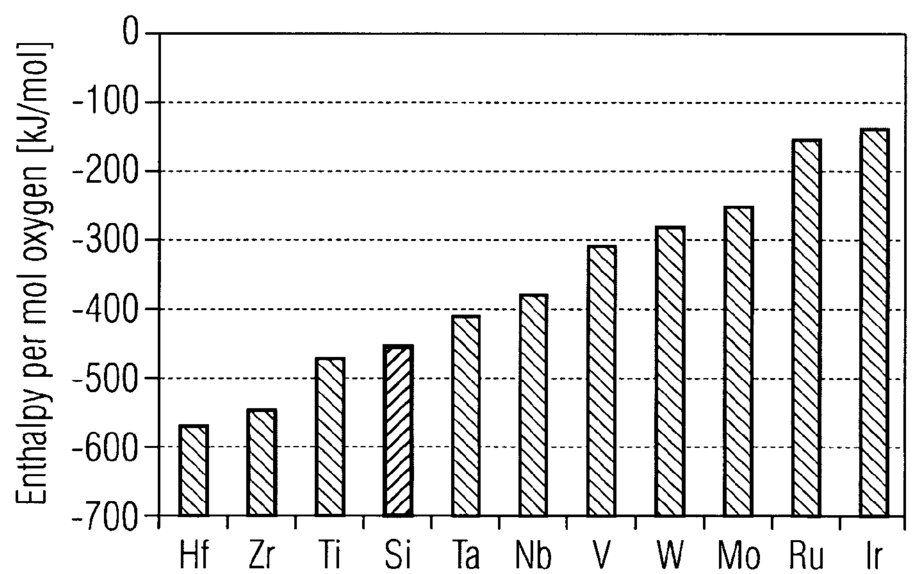
FIG. 17 shows an exemplary enthalpy diagram of oxide compounds of various chemical elements that may be used in embodiments of the invention.

In order to demonstrate the use of potential transition metals for the metallic layer 320 and the metal oxide layer 330 by way of an example, FIG. 17 shows an enthalpy diagram of oxide compounds of various chemical elements. The diagram shows the enthalpy per mole of oxygen for each of the individual chemical elements, which corresponds to the energy released during formation of a corresponding oxide compound with a mole of oxygen. Therefore, an oxide compound is all the more stable, the more negative the associated enthalpy is. In FIG. 17, the stability of oxide compounds of the illustrated chemical elements increases from right to left.

Transition metals which may e.g. be considered for the metallic layer 320 may include the elements arranged on the right side of Si in FIG. 17, i.e. Ta, Nb, V, W, Mo, Ru and Ir. In order to use a transition metal for the metal oxide layer 330, the oxide of which has a lower binding energy, respective elements arranged on the right side of the relevant transition metal of the metallic layer 320 may be selected. This is further illustrated by Table 1:

TABLE 1

| Transition metal for metallic layer | Transition metal for metal oxide layer |
|---|---|
| Ta, Nb | V, W, Mo, Ru, Ir |
| V, W | Mo, Ru, Ir |
| Mo | Ru, Ir<br>W (see below) |

It is furthermore possible that the generated metal oxide layer 330 comprises a substantially stoichiometric oxide, i.e. that substantially all transition metal atoms of the metal oxide layer 330 are oxidically bound. After performing the temperature step(s), the metal oxide layer 330 as well as the oxidized metallic layer 320' may comprise a substoichiometric oxide.

In some embodiments, it may also be possible to use transition metals for the metallic layer 320 and the metal oxide layer 330 in which the binding energy of oxide compounds differ only slightly, or in which the binding energy of the transition metal of the metal oxide layer 330 is even larger than of the transition metal of the metallic layer 320. This approach may be based on the fact that in the course of the temperature step(s) the oxygen originally bound in the metal oxide layer 330 may be "distributed" among the two layers 320, 330. If Mo is used as a transition metal for the metallic layer 320, e.g. W may be considered for the metal oxide layer 330 in spite of the higher binding energy, as is shown in Table 1. It is also possible to use the same transition metals for the two layers 320, 330.

Figure 15:
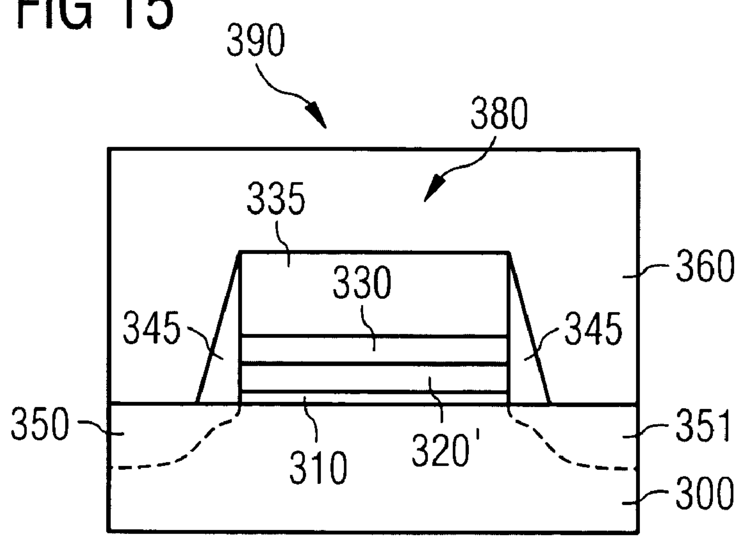

Upon oxidation of the metallic layer 320', the transistor 390 having the gate 380 may be substantially finished, as shown in FIG. 15. By means of the metallic layer 320', the work function of the gate 380 and thus the threshold voltage of the transistor 390 are influenced. As described above, the two layers 320' and 330 may each comprise a substoichiometric oxide. Furthermore, in some embodiments, the layer 330 may transfer a substantial portion of its oxygen to the metallic layer 320 during the temperature step(s) and afterwards is thus substantially present as a pure metal layer. Furthermore, when using the same transition metals in the layers 320, 330, the two layers 320', 330, which may originally be differentiated, may also be present as a "joint" layer (not shown).

Figure 16:
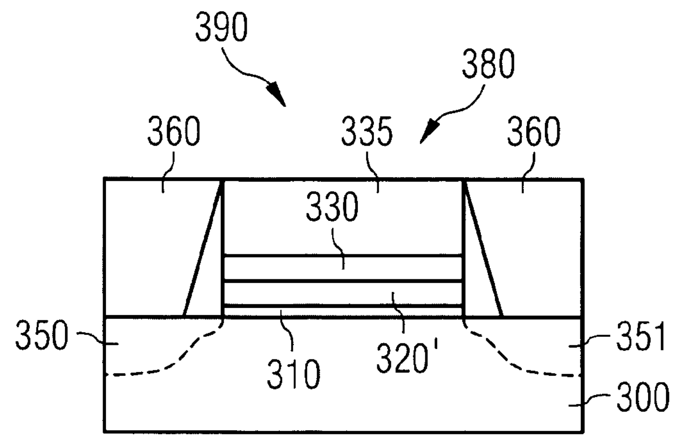

Additionally, as shown in FIG. 15, a further dielectric layer 360 may be formed on the upper face of the substrate 300, the dielectric layer 360 surrounding the gate 380 of the transistor 390. Materials for the dielectric layer 360 may include boron phosphorus silicate glass, and the like, which may be deposited by means of a CVD process, a spin-on dielectric, or silicon dioxide which may be deposited by means of a TEOS process. Optionally, as illustrated in FIG. 16, a portion of the dielectric layer 360 may subsequently be removed in such a way that a surface of the gate stack 380 is uncovered. For this purpose, a polishing process such as a CMP process may be carried out.

Also the method described with reference to FIGS. 13 to 17 may be based on the approach to first form the metallic layer 320 without an oxygen portion and to oxidize it in a later process stage, so that an out-diffusion of oxygen from the metallic layer 320' may be avoided. By means of the metal oxide layer 330, the oxidation of the metallic layer 320 may be realized involving relatively little time and effort. Temperature steps such as an annealing step for activating implanted dopants or an annealing step for curing defects may be performed prior to oxidizing the metallic layer 320. Alternatively, however, temperature steps may be used as described above for various purposes, and as a result, the oxidizing of the metallic layer 320 by means of an oxygen diffusion from the metal oxide layer 330 into the metallic layer 320 may be performed together with the activation of implanted dopants and/or the annealing of defects.

The embodiments described with reference to the Figures are examples and therefore not to be considered limiting. Further embodiments may be realized which comprise further modifications. Instead of the materials indicated for the methods and transistors, e.g. other materials may be used. The same applies for temperature and time information with respect to the described temperature steps. Moreover, the methods are not limited to the fabrication of one single transistor or a single transistor type.

Furthermore, the methods may comprise other process steps provided for the fabrication of an integrated circuit apart from the described process steps. These process steps for example relate to the fabrication of further components of an integrated circuit on a substrate such as memory cells, n-conducting transistors etc.

In order to protect such components during process steps for fabricating the transistors 190, 290, 390, respective masking layers which are also referred to as "block mask" may be configured on the associated substrate regions. The use of such a masking layer is e.g. possible when removing the sacrificial layer 130 by means of a wet chemistry etch as explained in conjunction with FIG. 4, and when performing an implanting process for introducing oxygen into the conductive layer 230 as explained in conjunction with FIG. 11.

The preceding description describes embodiments of the invention. The features disclosed therein and the claims and the drawings can, therefore, be useful for realizing the invention in its various embodiments, both individually and in any combination. While the foregoing is directed to embodiments of the invention, other and further embodiments of this invention may be devised without departing from the basic scope of the invention, the scope of the present invention being determined by the claims that follow.

What is claimed is:

1. A method of making an integrated circuit comprising:

providing a substrate;

forming a structured layer stack on the substrate for a gate of a transistor, the structured layer stack comprising a dielectric layer formed on the substrate, an oxide-free metallic layer formed on the dielectric layer, the metallic layer comprising a transition metal, and a metal oxide layer formed on the metallic layer comprising a first transition metal oxide compound; and oxidizing the metallic layer, thereby increasing a work function of the metallic layer, wherein oxidizing the metallic layer comprises performing a temperature step to cause a diffusion of oxygen from the metal oxide layer into the metallic layer and a formation of a second transition metal oxide compound in the metallic layer, and wherein the second transition metal oxide compound has a higher binding energy than the first transition metal oxide compound.

2. The method according to claim 1, wherein the structured layer stack is formed comprising a conductive layer on the metal oxide layer.

3. The method according to claim 2, wherein the conductive layer comprises tungsten, aluminum, copper or tungsten nitride.

4. The method according to claim 1, wherein the temperature step is performed at a temperature in a range of up to 1300° C.

5. The method according to claim 1, further comprising forming two doped regions in the substrate each of the two doped regions forming one of a source and drain of the transistor.

6. The method according to claim 5, wherein the two doped regions are formed prior to oxidizing the metallic layer.

7. The method according to claim 1, wherein the structured layer stack further comprises sidewalls and dielectric spacers at the sidewalls.

8. The method according to claim 1, wherein the metallic layer comprises one of Ta, Nb, V, W, Mo, Ru, Ir, Re, Os, Rh, Pd, Ni, Co.

9. The method according to claim 1, wherein the transition metal of the metallic layer is present in one of the following forms: a pure metal, a carbide, a nitride and a carbonitride.

10. The method according to claim 1, wherein the dielectric layer comprises a high-k dielectric.

11. The method according to claim 1, wherein the method is used to make a p-FET.

12. A method of making an integrated circuit comprising:

providing a substrate;

forming a structured layer stack on the substrate for a gate of a transistor, the structured layer stack comprising a dielectric layer formed on the substrate, an oxide-free metallic layer comprising a transition metal formed on the dielectric layer, a metal oxide layer formed on the metallic layer, and a conductive layer formed on the metal oxide layer, the conductive layer having a lower oxygen affinity compared to the metal oxide layer; and oxidizing the metallic layer, thereby increasing a work function of the metallic layer, wherein oxidizing the metallic layer comprises performing a temperature step to cause a diffusion of oxygen from the metal oxide layer into the metallic layer.

13. A method of making an integrated circuit comprising:

providing a substrate;

forming a structured layer stack on the substrate for a gate of a transistor, the structured layer stack comprising a dielectric layer formed on the substrate, an oxide-free metallic layer comprising a first transition metal formed on the dielectric layer, a metal oxide layer comprising a second transition metal formed on the metallic layer, wherein the first and second transition metals comprise the same transition metals; and oxidizing the metallic layer, thereby increasing a work function of the metallic layer, wherein oxidizing the metallic layer comprises performing a temperature step to cause a diffusion of oxygen from the metal oxide layer into the metallic layer.

* * * * *